US008819530B1

(12) United States Patent
Yeo et al.

(10) Patent No.: US 8,819,530 B1
(45) Date of Patent: *Aug. 26, 2014

(54) ITERATIVE DECODER MEMORY ARRANGEMENT

(71) Applicant: Marvell International Ltd., Hamilton (BM)

(72) Inventors: Engling Yeo, San Jose, CA (US); Panu Chaichanavong, Sunnyvale, CA (US); Nedeljko Varnica, Sunnyvale, CA (US); Gregory Burd, San Jose, CA (US); Zining Wu, Los Altos, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

This patent is subject to a terminal disclaimer.

(21) Appl. No.: 13/973,880

(22) Filed: Aug. 22, 2013

Related U.S. Application Data

(63) Continuation of application No. 13/556,063, filed on Jul. 23, 2012, now Pat. No. 8,522,123, which is a continuation of application No. 12/350,885, filed on Jan. 8, 2009, now Pat. No. 8,230,312.

(60) Provisional application No. 61/019,952, filed on Jan. 9, 2008.

(51) Int. Cl.
    *H03M 13/03*   (2006.01)
(52) U.S. Cl.
    USPC .......................................................... 714/795

(58) Field of Classification Search
    USPC .......................................................... 714/795
    See application file for complete search history.

(56) References Cited

U.S. PATENT DOCUMENTS

| | | | |
|---|---|---|---|
| 6,711,225 | B1 | 3/2004 | Sutardja et al. |
| 7,266,750 | B1 | 9/2007 | Patapoutian et al. |
| 7,453,960 | B1 | 11/2008 | Wu et al. |
| 7,467,347 | B2 | 12/2008 | Orio |
| 7,484,158 | B2 | 1/2009 | Sharon et al. |
| 7,571,375 | B2 | 8/2009 | Kim et al. |

(Continued)

OTHER PUBLICATIONS

Yeo et al., "Iterative Decoder Architectures," Capacity Approaching Codes, Iterative Decoding Algorithms, and their Applications, IEEE Communications Magazine, vol. 41, No. 8, pp. 132-140, Aug. 2003.

(Continued)

*Primary Examiner* — Michael Maskulinski

(57) ABSTRACT

The present disclosure includes apparatus, systems and techniques relating to iterative decoder memory arrangement. A described apparatus includes R banks; Q banks; circuitry configured to store R data for a current codeword in a first R bank of the R banks and store R data for a previous codeword in a second R bank of the R banks; circuitry configured to alternate among the R banks for storing current codeword R data; circuitry configured to store Q data for the current codeword in a first Q bank of the Q banks and store Q data for the previous codeword in a second Q bank of the Q banks; and circuitry configured to alternate among the Q banks for storing current codeword Q data. The apparatus can include circuitry configured to interleave read accesses among the R banks.

20 Claims, 16 Drawing Sheets

(56) References Cited

U.S. PATENT DOCUMENTS

| | | |
|---|---|---|
| 7,583,751 B1 | 9/2009 | Burd et al. |
| 7,831,883 B2 | 11/2010 | Tong et al. |
| 7,911,364 B1 | 3/2011 | Zhang et al. |
| 2005/0190477 A1 | 9/2005 | Taguchi et al. |
| 2006/0156171 A1 | 7/2006 | Kuznetsov et al. |
| 2007/0283220 A1 | 12/2007 | Kim |
| 2008/0052595 A1 | 2/2008 | Haratsch et al. |
| 2008/0072122 A1 | 3/2008 | Nimbalker et al. |
| 2008/0235561 A1 | 9/2008 | Yang |
| 2008/0282129 A1 | 11/2008 | Blanksby |
| 2009/0019335 A1 | 1/2009 | Boyer et al. |
| 2009/0150746 A1 | 6/2009 | Chaichanavong et al. |

OTHER PUBLICATIONS

Mansour et al., "Memory-Efficient Turbo Decoder Architectures for LDPC Codes," IEEE Journal of Solid-State Circuits, vol. 41, No. 3, pp. 684-698, Mar. 2006.

Luby et al., "Improved Low-Density Parity-Check Codes Using Irregular Graphs", IEEE Transactions on Information Theory, vol. 47(2), pp. 585-598, Feb. 2001.

Richardson et al., "The Capacity of Low-Density Parity-Check Codes Under Message-Passing Decoding", IEEE Transactions on Information Theory, vol. 47, Feb. 2001, 599-618.

Richardson et al., "Design of capacity-approaching irregular low-density parity-check codes," IEEE Transactions on Information Theory, vol. 47, pp. 619-637, Feb. 2001.

Kavcic et al., "Binary ISI Channels: Gallager Codes, Density Evolution and Code Performance Bounds", IEEE Transactions on Information Theory, Jul. 2003, 100-118.

ITERATIVE DECODER MEMORY ARRANGEMENT

CROSS REFERENCE TO RELATED APPLICATIONS

This present disclosure is a continuation of and claims the benefit of priority of U.S. patent application Ser. No. 13/556,063, filed Jul. 23, 2012 and entitled "ITERATIVE DECODER MEMORY ARRANGEMENT" (now U.S. Pat. No. 8,522,123), which is a continuation of and claims the benefit of priority of U.S. patent application Ser. No. 12/350,885, filed Jan. 8, 2009 and entitled "ITERATIVE DECODER MEMORY ARRANGEMENT" (now U.S. Pat. No. 8,230,312), which claims the benefit of the priority of U.S. Provisional Application Ser. No. 61/019,952, filed Jan. 9, 2008 and entitled "FS MEMORY ARRANGEMENT", each of which are incorporated herein by reference in their entirety.

BACKGROUND

The present disclosure describes systems and techniques relating to Low Density Parity Check iterative decoders.

Basic components of a communication system include a transmitter, a channel, and a receiver. Factors such as noise corruption and channel distortion can introduce errors into data transmitted by the transmitter. To address such introduced errors, the receiver can use a decoder to make error corrections. Low Density Parity Check (LDPC) iterative decoder is one such decoder that can provide error correction in wired, wireless, and optical communications for example.

SUMMARY

The present disclosure includes systems and techniques relating to iterative decoder memory arrangement. According to an aspect of the described systems and techniques, an apparatus includes a memory module to communicate with an iterative code decoder. The memory module includes a single R memory component to store R data associated with a current codeword, and R data associated with a previous codeword. The memory module includes a Q memory component to store Q data associated with the current codeword, and Q data associated with the previous codeword. The memory module includes a channel detector memory component to store channel extrinsic information.

Implementations can optionally include one or more of the following features. A channel detector can be in communication with the memory module to access the R data stored in the single R memory component. The channel detector can include a soft output Viterbi algorithm decoder. The channel detector can be operable to access the Q memory component. The iterative code decoder can include a low density parity check code decoder. The Q memory component can include a Soft Output Viterbi Algorithm memory component. The Q memory component can include two memory banks. The channel detector memory component can include extrinsic channel log-likelihood-ratio memory component. The channel detector memory component can include two memory banks. The single R memory component can include a single port memory component.

The described systems and techniques can be implemented in electronic circuitry, computer hardware, firmware, software, or in combinations of them, such as the structural means disclosed in this specification and structural equivalents thereof. This can include at least one computer-readable medium embodying a program operable to cause one or more data processing apparatus (e.g., a signal processing device including a programmable processor) to perform operations described. Thus, program implementations can be realized from a disclosed method, system, or apparatus, and apparatus implementations can be realized from a disclosed system, computer-readable medium, or method. Similarly, method implementations can be realized from a disclosed system, computer-readable medium, or apparatus, and system implementations can be realized from a disclosed method, computer-readable medium, or apparatus.

For example, the disclosed embodiment(s) below can be implemented in various systems and apparatus, including, but not limited to, a special purpose data processing apparatus (e.g., a wireless access point, a remote environment monitor, a router, a switch, a computer system component, a medium access unit), a mobile data processing apparatus (e.g., a wireless client, a cellular telephone, a personal digital assistant (PDA), a mobile computer, a digital camera), a general purpose data processing apparatus (e.g., a minicomputer, a server, a mainframe, a supercomputer), or combinations of these.

Thus, according to another aspect of the described systems and techniques, a system can include a channel detector and an iterative code decoder in communication with the channel detector to decode codewords. The system also includes a memory module in communication with the iterative code decoder and the channel detector. The memory module includes a single R memory component to store R data associated with a current one of the codewords being decoded by the code decoder and R data associated with a previous one of the codewords. The Memory module includes a Q memory component to store Q data associated with the current codeword and Q data associated with the previous one of the codewords. The memory module includes a channel detector memory component to store channel extrinsic information. The channel detector and the iterative code decoder are operable to pass a bit reliability metric comprising a log-likelihood-ratio message between each other.

Implementations can optionally include one or more of the following features. The channel detector can include a soft output Viterbi algorithm decoder. The Q memory component can include a Soft Output Viterbi Algorithm memory component. The Q memory can include two memory banks. The iterative code decoder can include a low density parity check code decoder. The channel detector memory component can include an extrinsic channel log-likelihood-ratio memory component. The channel detector memory component can include two memory banks. The single R memory component can include a single port memory component. The channel detector can include a soft-input-soft-output channel detector. The channel detector can be configured to perform a single read access from each of the Q memory component and the R memory component per data bit.

The described systems and techniques can result in one or more of the following advantages. A shallow depth of conventional R memory can lead to larger than desirable areas for the memory modules. Two banks of memories can be combined into one memory to obtain an increased number of addresses, and hence improved memory density. Also, the constraint for increased number of memory ports can be minimized or avoided by implementing an additional Soft Output Viterbi Algorithm (SOVA) memory.

Details of one or more implementations are set forth in the accompanying drawings and the description below. Other features, objects and advantages may be apparent from the description and drawings, and from the claims.

DRAWING DESCRIPTIONS

Like reference symbols in the various drawings indicate like elements.

DETAILED DESCRIPTION

The systems and techniques described herein can be implemented as one or more devices, such as one or more integrated circuit (IC) devices in a wireless communication device. For example, the systems and techniques disclosed can be implemented in a wireless local area network (WLAN) transceiver device (e.g., a WLAN chipset) suitable for use in an orthogonal frequency-division multiplexing (OFDM) multiple-input and multiple-output (MIMO) system.

Figure 1A:
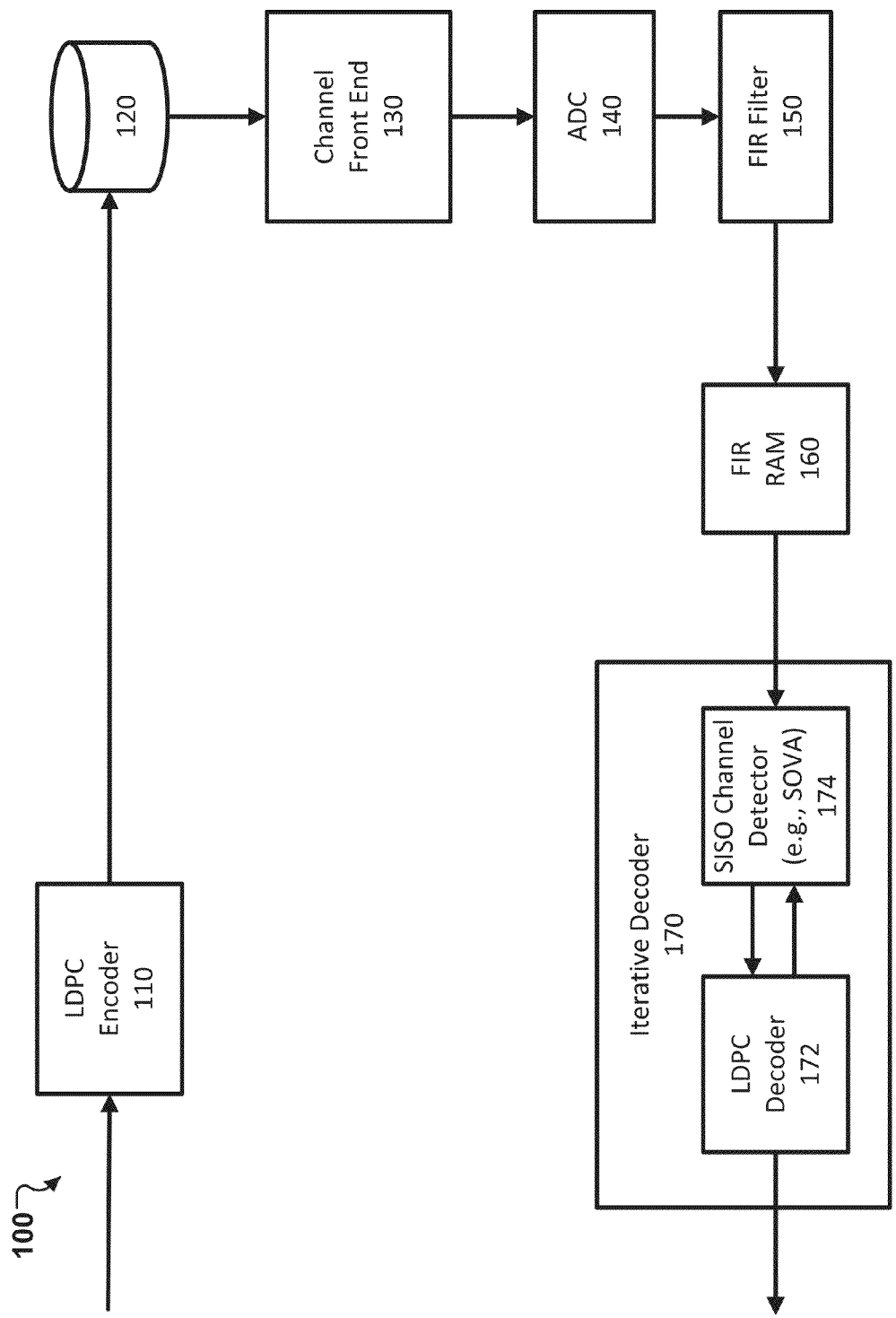
FIG. 1a shows a block diagram of an example turbo equalization system.

FIG. 1a shows a block diagram of an example turbo equalization system 100. The system 100 includes an LDPC encoder 110, a channel 120 with memory or storage, an analog channel front end 130, an analog-to-digital converter (ADC) 140, a finite impulse response (FIR) filter 150, a FIR memory, such as FIR Random Access Memory (RAM) 160, and an iterative decoder 170. Iterative decoder 170 includes a Soft Input Soft Output (SISO) channel decoder 174, such as a Soft Output Viterbi Algorithm (SOVA) channel decoder, and an LDPC decoder 172.

User data is encoded with the LDPC encoder 110, and the LDPC encoded user data is transmitted over the channel 120 to a receiver side. On the receiver side, the analog waveform from the channel 120 is filtered by the analog channel front end 130, and the filtered analog waveform is sampled by the ADC 140. The ADC samples are equalized by the FIR filter 150 and provided to the iterative decoder 170. The FIR channel samples from the FIR filter 150 can also be stored in the FIR RAM 160. The SISO channel detector 174 of the iterative decoder 170 receives the FIR channel samples and prior information from the LDPC decoder 172 of the iterative decoder 170. At first iteration, the prior information is set to 0 for all bits in the iterative codeword. Based on the received FIR channel samples and the prior information, the SISO channel detector 174 produces reliability information. Reliability information from the SISO channel detector 174 is forwarded to the LDPC decoder 172. The LDPC decoder 172 generates updated reliability information based on code constraints, and sends the updated reliability information back to the SISO channel detector 174. This process is repeated till a stopping criterion has been met.

Figure 1B:
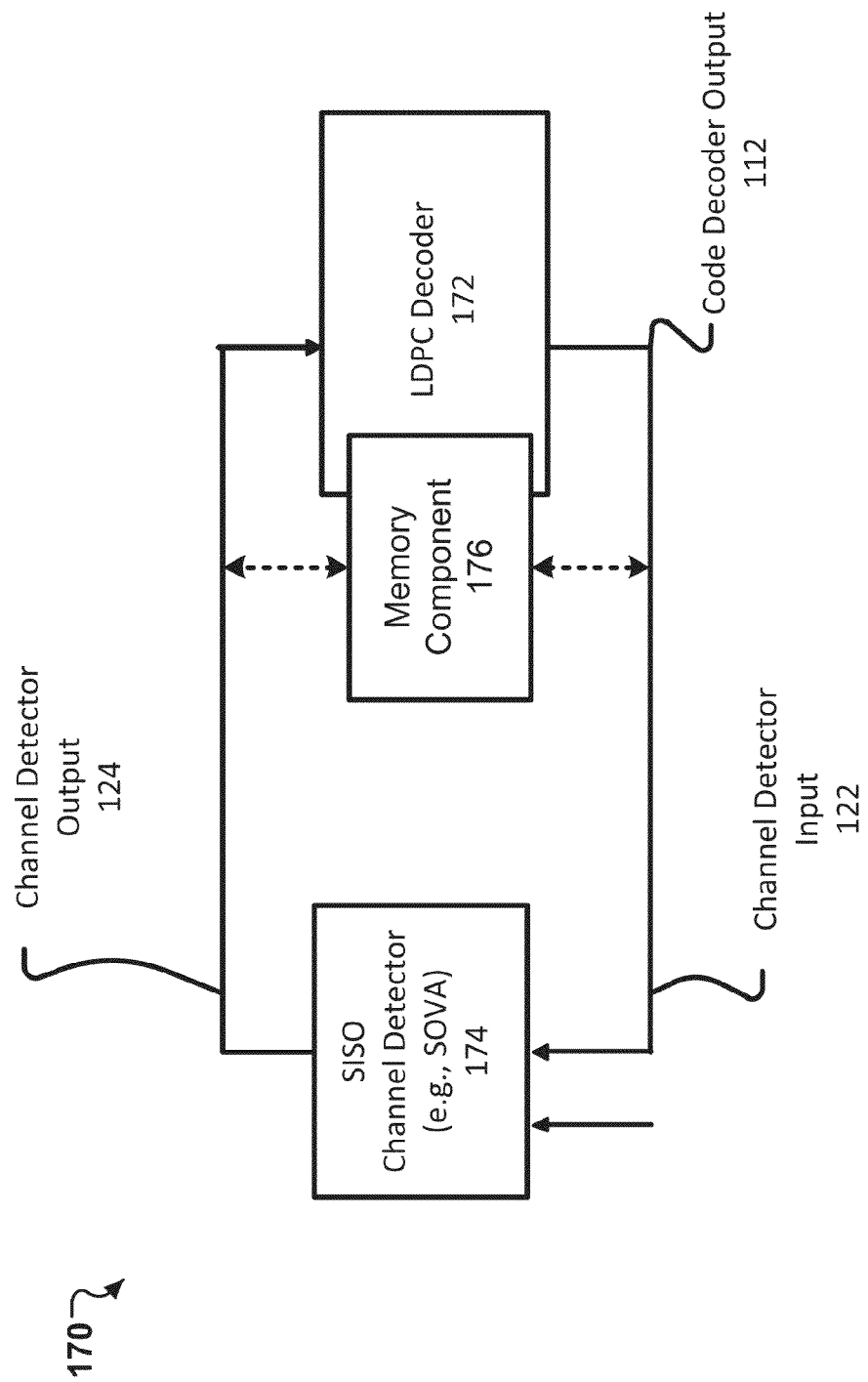
FIG. 1b is a block diagram showing an example iterative decoder for providing error correction in a communication system.

FIG. 1b shows a more detailed diagram of an iterative decoder (e.g., iterative decoder 170). As shown in FIG. 1a, the iterative decoder 170 includes the SISO channel detector 174 to communicate with the LDPC decoder 172. The iterative decoder 170 also includes a memory component 176 to communicate with the SISO channel detector 174 and the LDPC decoder 172. The memory component 176 can be included as a part of the LDPC decoder 172 or implemented as a separate memory component external to the LDPC decoder 172.

Examples of the SISO channel detector 174 include SOVA and BCJR algorithm. SOVA is based on the classical Viterbi algorithm and uses a modified path metric to take into account the a priori probabilities of input symbols or bits and produces a soft output indicating the reliability of a decision about the input symbols.

BCJR algorithm is named after its inventors Bahl, Cocke, Jelinek and Raviv. BCJR algorithm is an algorithm for maximum a posteriori decoding of error correcting codes defined on trellises (principally convolutional codes). The interaction between the LDPC decoder 172 and the BCJR decoder can be implemented as described by Yeo et al. (see E. Yeo, B. Nikolic, V. Anantharam, "Iterative Decoder Architectures." IEEE Communications Magazine, vol. 41, no.8, pp. 132-140, August 2003), the contents of which are incorporated by references.

The LDPC decoder 172 corresponds to a low-density parity-check code (LDPC code) decoder. An LDPC code is an error correcting code used to correct errors when transmitting data over a noisy transmission channel.

The iterative decoder 170 iterates between the channel detector 174 and the LDPC decoder 172. The information (e.g., channel detector output 124) from previous channel detector iteration is provided as an input to next LDPC decoding iteration. The information (e.g., code decoder output 112) from the LDPC decoding is provided as an input (e.g., channel detector input 122) to the next channel detector iteration. Data reliability is improved with each additional iteration.

The information passed between the channel detector 120 and the code decoder 110 represents a bit reliability metric, such as a log-likelihood-ratio (LLR) message. The LLR can be obtained using a natural logarithmic function (see Equation 1) of the ratio of the probability of the value being 1 to the probability of the value being 0.

$$LLR(b_i) = \log\left(\frac{P(b_i = 0)}{P(b_i = 1)}\right) \qquad \text{(Equation 1)}$$

An LLR value can include a sign that indicates whether the transmitted bit is determined to be "0" or "1", and a magnitude representing the confidence of that determination.

Figure 2:
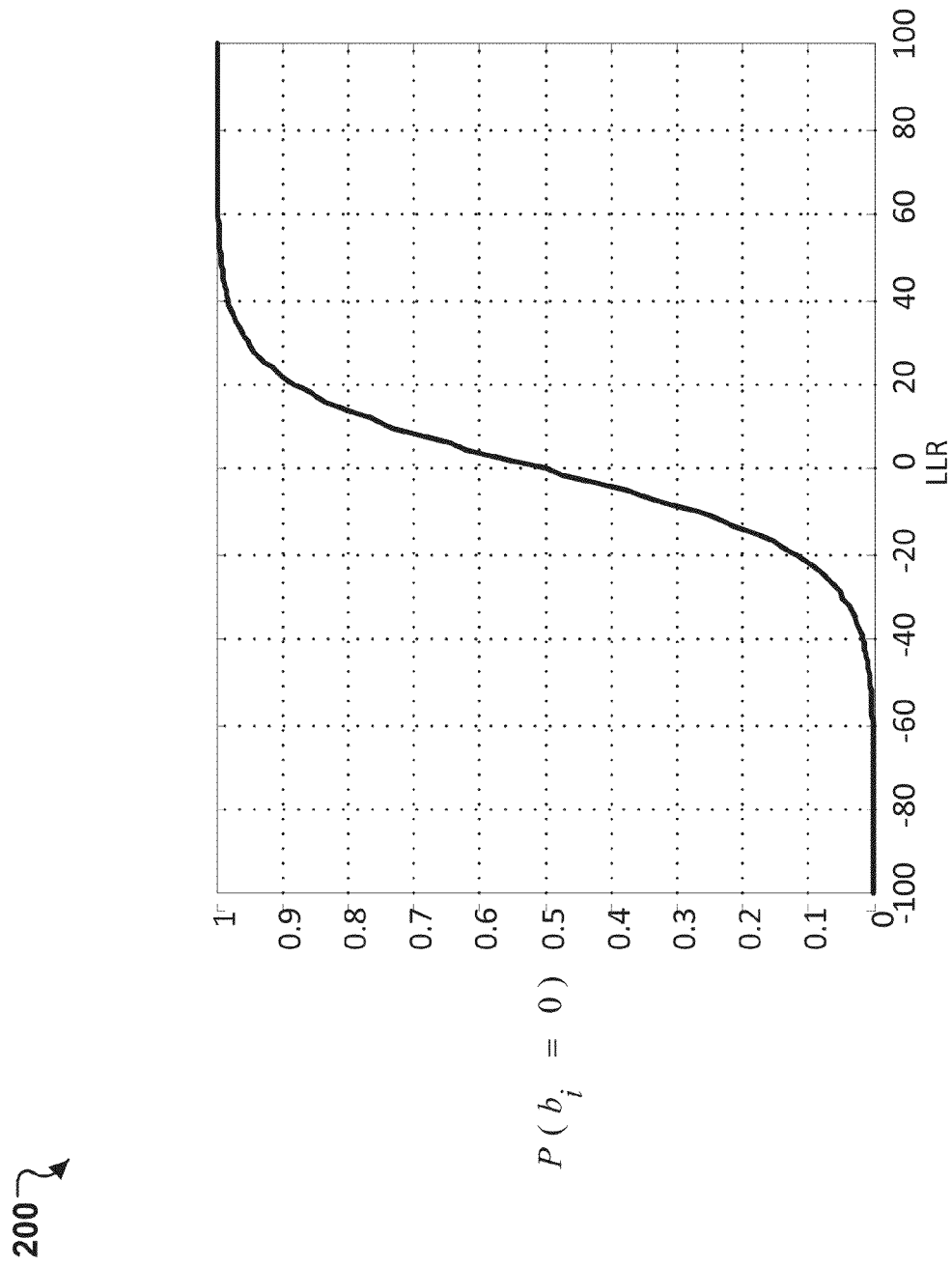
FIG. 2 is a chart showing an example relationship between a probability value and a log-likelihood-ratio value.

FIG. 2 is a chart 200 showing an example relationship between a probability value and an LLR value. The x-axis represents the value of LLR and the y-axis represents the probability value (e.g., probability of $b_i$=0). Values of LLR>0 indicate a higher probability that the value of the transmitted bit is 0. Values of LLR<0 indicate a higher probability that the value of the transmitted bit is 1.

An LDPC code that can be decoded by the code decoder 110 can be represented using parity check matrices. An (N, K) LDPC code is a parity check code, where K is the number of bits to be encoded, N is the size (or length) of the resulting coded block and M (N−K) represents the additional error correction bits added by the code. Thus, an LDPC code, C, is specified in terms of a low-density (sparse) M-by-N binary parity check matrix H having dimensions M×N.

A binary string, c, of length N is a codeword in the LDPC code C, if and only if Equation 2 is satisfied.

$$Hc = \vec{0} \qquad \text{(Equation 2)}$$

For an example LDPC code where N=7 and K=5, the parity check matrix H is as shown in Equation 3.

$$H = \begin{bmatrix} 1 & 1 & 1 & 1 & 1 & 1 & 1 \\ 1 & 0 & 1 & 0 & 1 & 0 & 1 \\ 0 & 1 & 0 & 1 & 0 & 1 & 0 \end{bmatrix} \qquad \text{(Equation 3)}$$

Then, the binary string $c=(1,0,1,0,1,0,1)^7$ is a codeword in the LDPC code C. The codeword, c, is generated by introducing redundancy bits. For example, an LDPC encoder receives a word of length K and outputs a codeword (e.g., codeword c) of length N by inserting N−K redundancy bits into the received word.

Each bit of an LDPC codeword, c, corresponds to a column of the parity check matrix H. For example, bit 1 corresponds to the $1^{st}$ column of matrix H, bit 2 corresponds to the second column of matrix H, etc.

Figure 3:
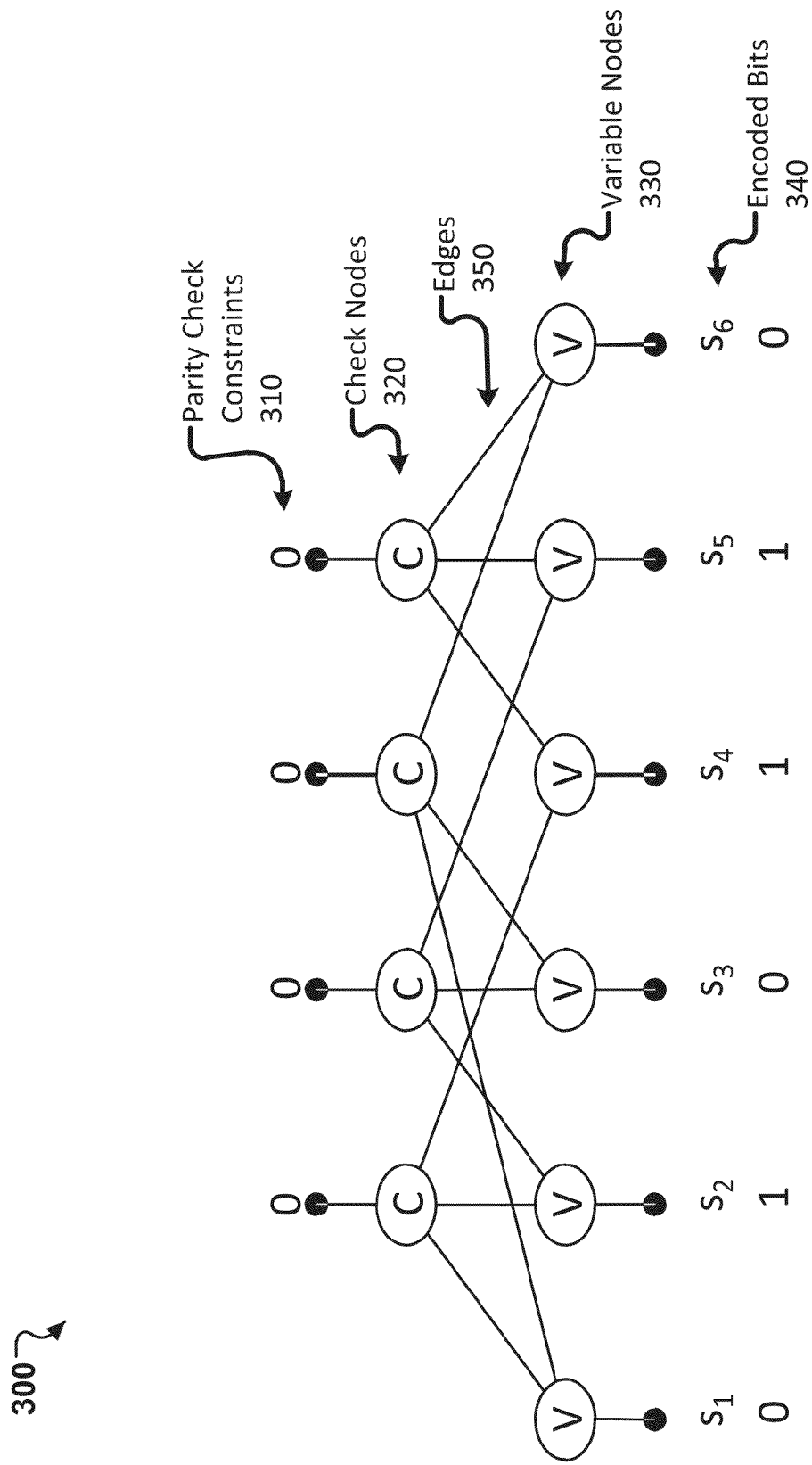
FIG. 3 shows an example bipartite graph for representing an LDPC code of length six that can be decoded by a decoding system.

Also, an LDPC code decoded by the code decoder 110 can be represented by a bipartite graph. FIG. 3 shows an example bipartite graph 300 for representing an LDPC code of length six that can be decoded by the system 100. Variable nodes 330 correspond to encoded bits 340 of a codeword. Check nodes 320 correspond to a set of parity-check constraints 310 which define the LDPC code. Edges 350 in the graph 300 connect the variable nodes 330 to the check nodes 320. A variable node and a constraint node are neighbors if the nodes are connected by an edge in the graph. A check node is connected to more than one variable node. Each bit "1" in the parity check matrix is represented by an edge between corresponding variable node 330 (parity check column) and check node 320 (parity check row).

Figure 4:
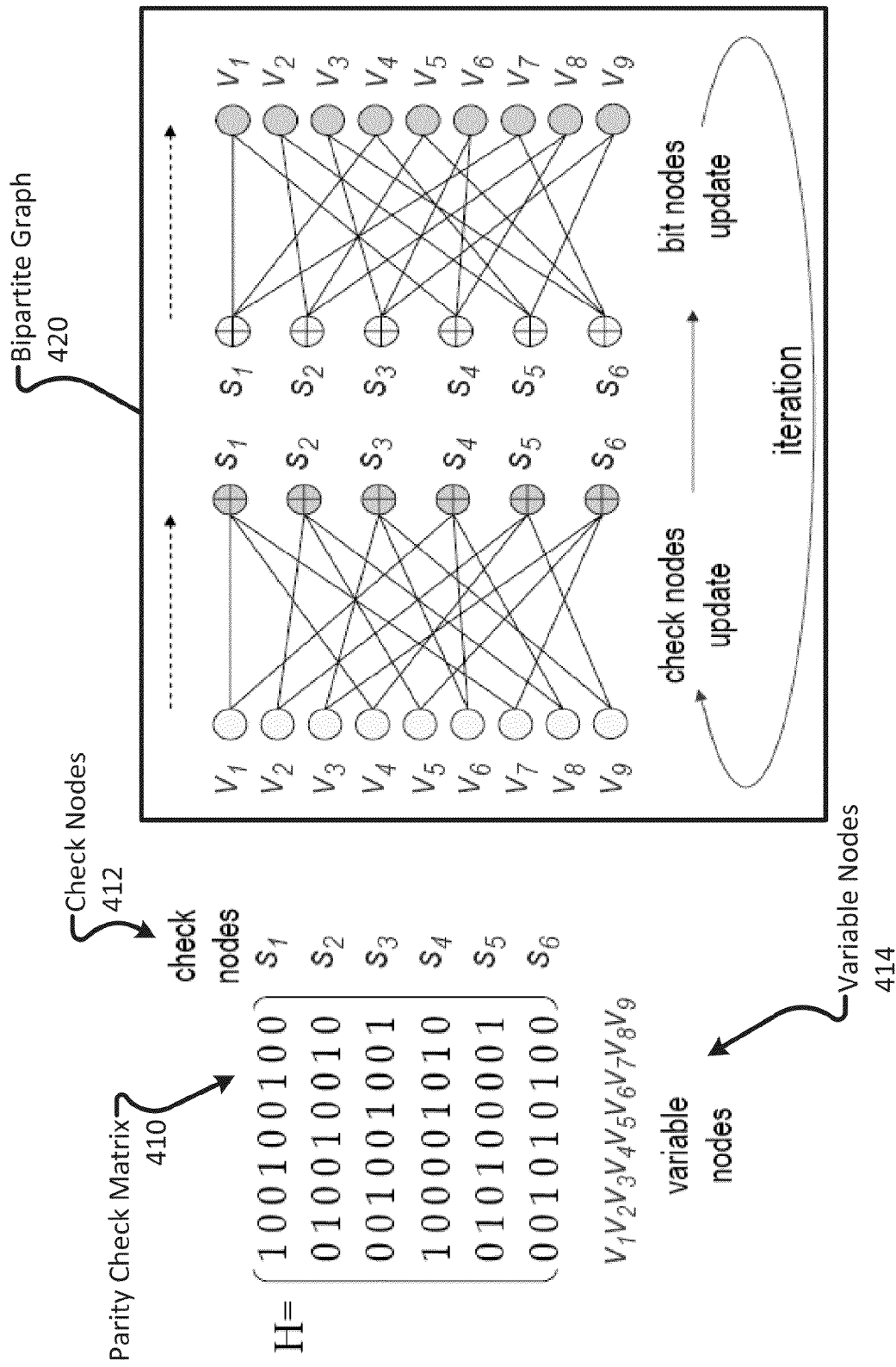
FIG. 4 shows an example iterative message passage algorithm.

FIG. 4 shows an example iterative message passage algorithm. An example parity check matrix H 410 is shown with check nodes 412 corresponding to rows of the parity check matrix H 410 and variable nodes 414 corresponding to columns of the check matrix H 410. FIG. 4 also shows bipartite graph 420 that correspond to the parity check matrix H 410. LDPC decoding is carried out using iterative message passage algorithm on the bipartite graph 420 corresponding to the parity check matrix H 410. The check nodes 412 and the variable nodes 414 are iteratively updated throughout each iteration. The messages passed from the variable nodes 414 to the check nodes 412 are denoted by Q messages, while the messages passed from the check nodes 412 to the variable nodes 414 are denoted by R messages.

Figure 5:
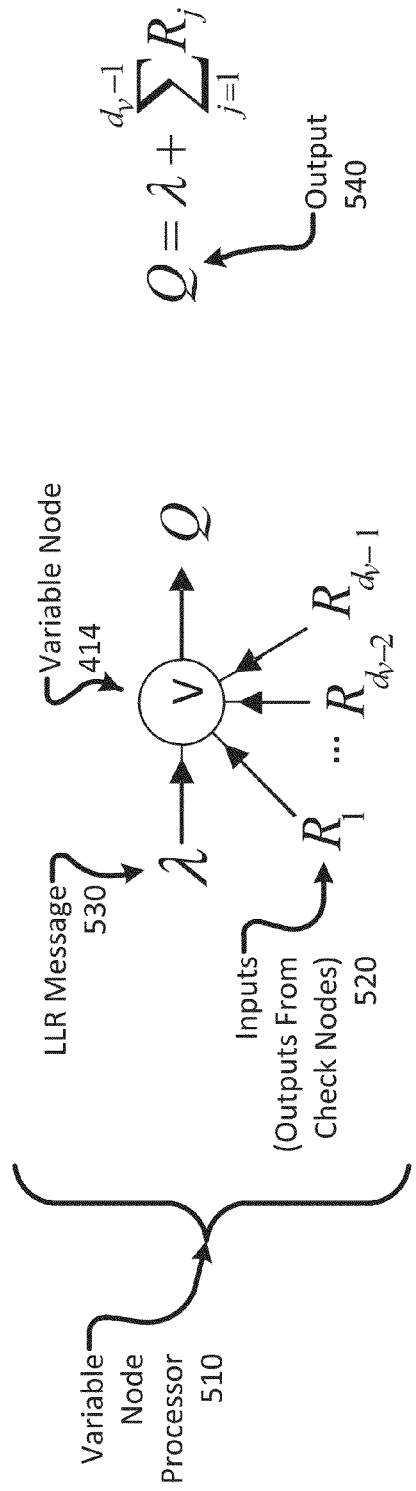
FIG. 5 shows an example process for updating variable nodes with degree dv.

FIG. 5 shows an exemplary operation of a variable node processor 510. A variable node processor gathers all the R messages received from the connected check nodes and generates updated Q messages. For a given variable node V 414, a Q message to a check node S is computed by summing up inputs $R_1 \ldots R_{d_v-2}, R_{d_v-1}$ 520 (check node outputs), excluding the one input received from check node S itself, and the log-likelihood ratio message λ 530, the extrinsic (new) information from a channel detector (e.g., channel detector 174). The variable node processor 510 can compute the Q message based on Equation 4.

$$Q = \lambda + \sum_{j=1}^{d_v-1} R_j \qquad \text{(Equation 4)}$$

Figure 6:
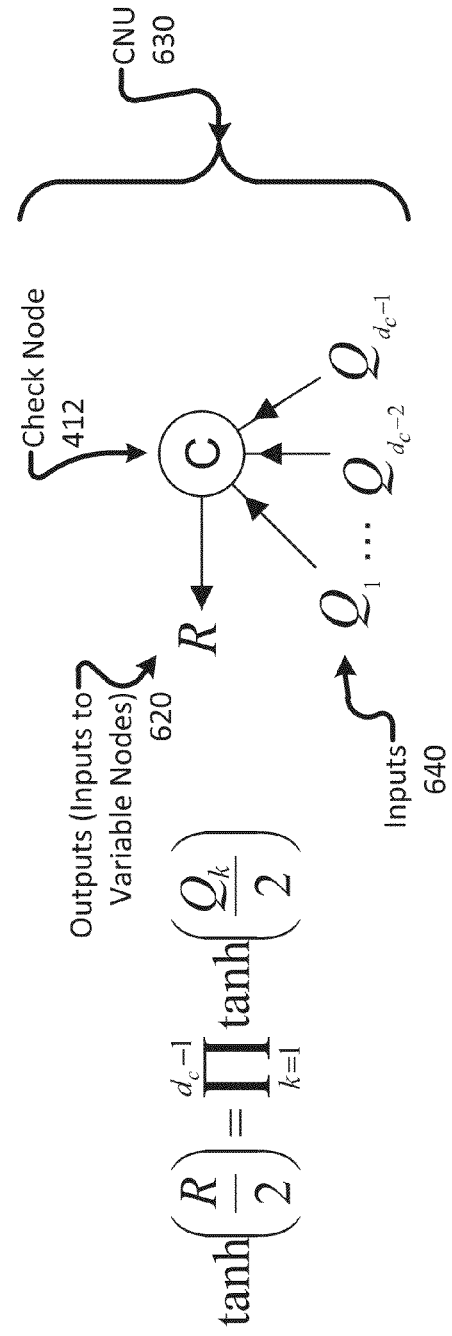
FIG. 6 is a diagram illustrating an example process for updating check nodes with degree $d_c$.

FIG. 6 is a diagram illustrating an example operation of a check node processor (CNU) 630. A CNU is responsible for updating check to bit messages, R. The CNU gathers all the Q messages received from connected variable nodes in the previous iteration and generates an updated R message to each participating bit according to Equation 5.

$$\tanh\left(\frac{R}{2}\right) = \prod_{k=1}^{d_c-1} \tanh\left(\frac{Q_k}{2}\right) \qquad \text{(Equation 5)}$$

Alternatively, the value of R can be calculated using MIN-SUM approximation. For example, a min-sum decoder that uses minimum approximation as shown in Equation 6 can be implemented.

$$R \approx \min(Q_1, \ldots, Q_{d_c-1}) \cdot \prod_{k=1}^{d_c-1} \text{sign}(Q_k) \qquad \text{(Equation 6)}$$

In the min-sum approximation, R messages can be stored in a conveniently compact form. That is, per check node, the following can be stored: (a) the signs of the R messages (or signs of incoming Q messages) and (b) 2 messages with the lowest magnitudes together with the index of the R message with the minimal magnitude. The information stored in this manner is sufficient to reconstruct all R messages corresponding to this check node. Using the min-sum approximation in this manner is described in U.S. Pat. No. 7,453,960 (entitled "LDPC encoder and encoder and method thereof"), the contents of which are incorporated by reference.

Figure 7:
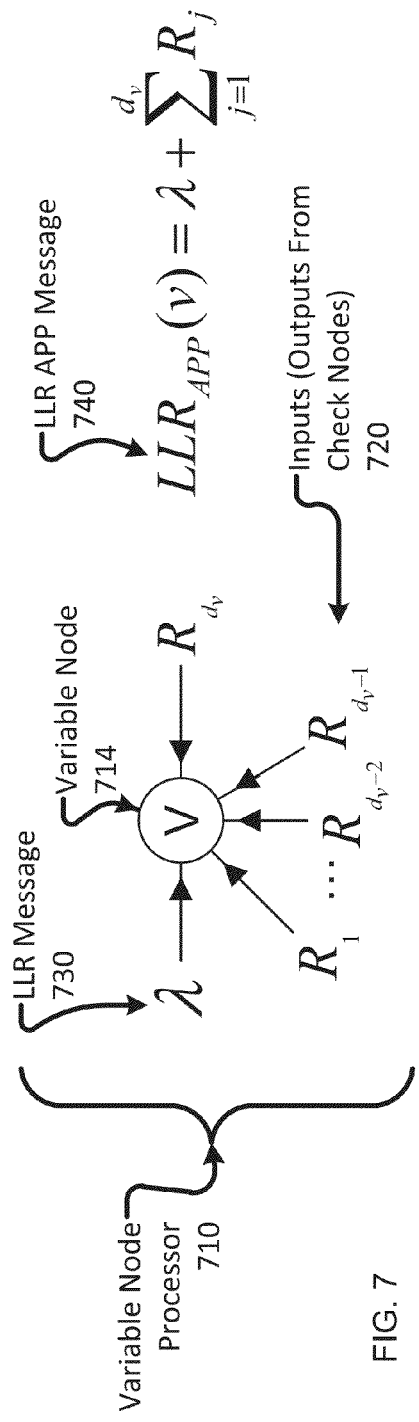
FIG. 7 is a diagram illustrating an example process for processing a posteriori probability (APP) LLR messages for v node with degree dv.

FIG. 7 is a diagram showing an example variable node processor 710. Following SISO or iterative decoder, the variable node processor 710 can be used to compute a posteriori probability (APP) LLR messages 740 (LLR APP messages 740) for a variable node V 714. A LLR APP message 740 represents the total reliability information (from the channel and code decoders) on a corresponding bit node. A LLR APP message 740 is computed by summing reliability information received from all the check nodes (e.g., R messages 720: $R_1 \ldots R_{dv-2}, R_{dv-1}, R_{dv}$) and the channel extrinsic LLR message 730 which includes λ. The LLR APP message 740 can be calculated using Equation 7.

$$LLR_{APP}(v) = \lambda + \sum_{j=1}^{d_v} R_j \qquad \text{(Equation 7)}$$

Figure 8:
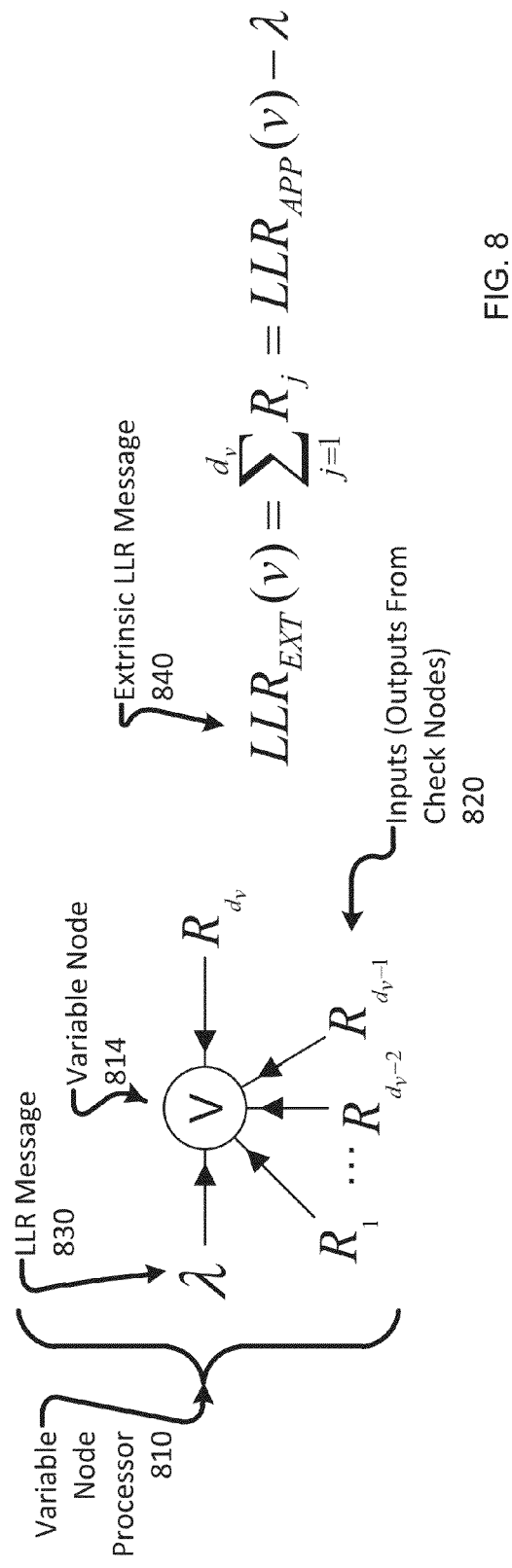
FIG. 8 is a diagram illustrating an example process for processing extrinsic (EXT) LLR messages for a variable node with degree dv.

Another quantity of interest to the iterative decoder 170 is the LDPC Extrinsic LLR (LLR EXT). FIG. 8 shows an example variable node processor 810 for calculating the LLR extrinsic (EXT) message 840. The LLR EXT message 840 represents new reliability information derived from each bit based on the LDPC code constraint. For a given variable node V 814, the LLR EXT can be computed either by summing all the R messages 820, or by subtracting channel extrinsic information, λ in the LLR message 830, from LLR. APP. For example, the LLR EXT message 840 can be calculated using Equation 8.

$$LLR_{EXT}(v) = \sum_{j=1}^{d_v} R_j = LLR_{APP}(v) - \lambda \qquad \text{(Equation 8)}$$

The SISO channel detector can usually output updated LLR_APP message. Updated channel extrinsic information can be obtained using Equation 9.

$$\lambda = LLR_{APP}(v) - LLR_{EXT}(v) = LLR_{APP}(v) - \sum_{j=1}^{d_v} R_j \qquad \text{(Equation 9)}$$

Figure 9:
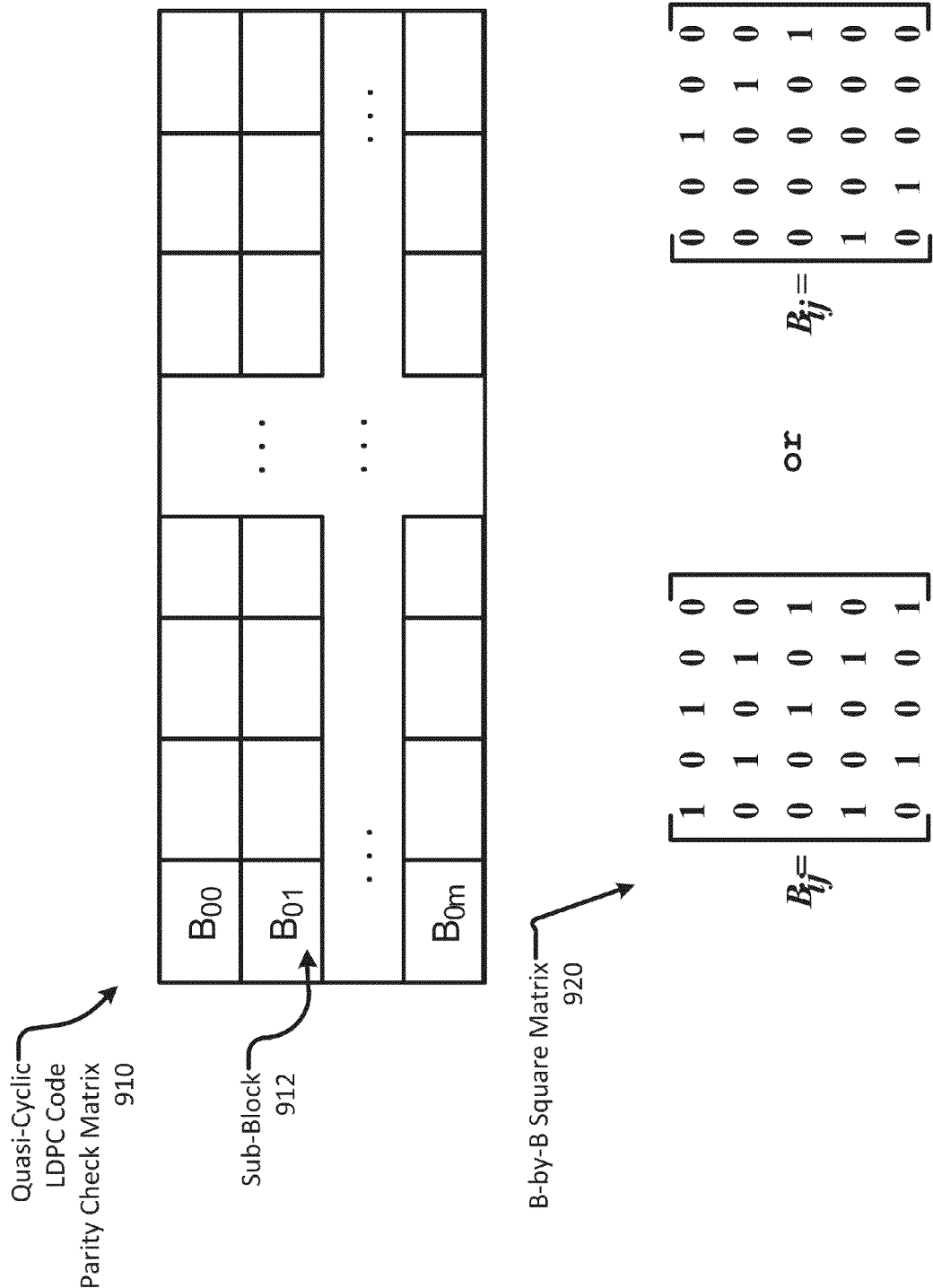
FIG. 9 shows example quasi-cyclic LDPC codes for efficient storage and processing.

To make hardware implementation of an LDPC decoder more efficient, the choice of code can be restricted to a quasi-cyclic LDPC codes for efficient storage and processing as shown in FIG. 9. Quasi-cyclic LDPC codes provide LDPC codes with a structured parity check matrix that makes storage and processing units efficient. Quasi-cyclic codes have parity check matrix 910 of the form shown in FIG. 9. Each sub-block 912 is a b-by-b square matrix 920, obtained by cyclically shifting the first row b times, for example.

The following describes a layered LDPC code decoder architecture. A layered decoder partitions parity check matrix H into several disjoint layers, each layer including a number of rows in the original matrix H. Quasi-cyclic LDPC code can be partitioned into layers according to circulant rows. Hence, the matrix of FIG. 9 can be partitioned into m layers, each layer having B equations (rows). In some implementations, layered decoders as described by Mansour et al. can be implemented (see M. Mansour and N. Shanbhag, "A 640-Mb/s 2048-bit programmable LDPC decoder chip," *IEEE Journal of Solid-State Circuits*, vol. 41, no.3, pp. 684- 698, March 2006), the contents of which are incorporated by reference. A layered LDPC decoder treats the LDPC code as a serially concatenated set of LDPC component codes (or layers). The layered decoder decodes the first iterative sub-code (layer), and then moves to the next layer.

Figure 10:
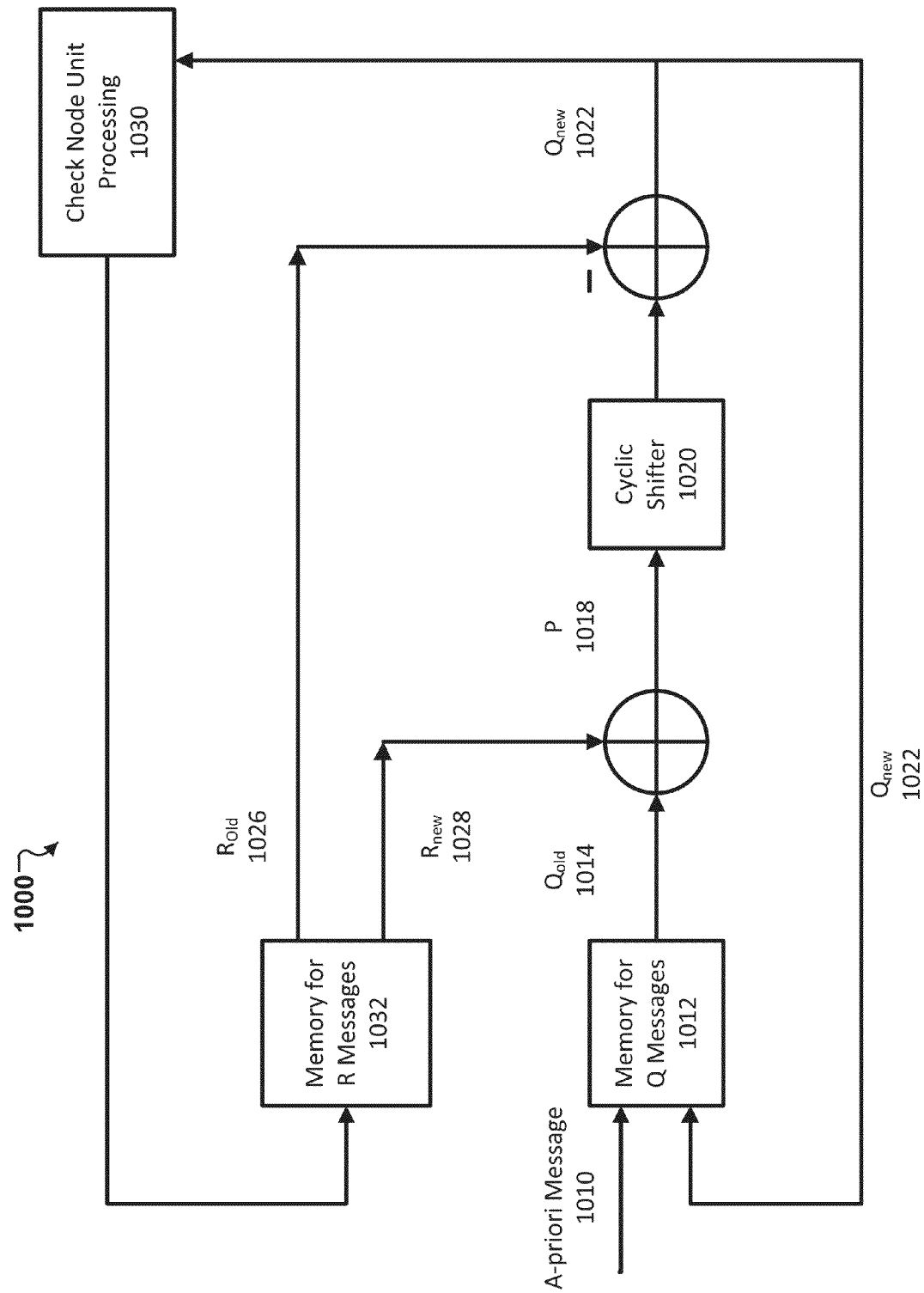
FIG. 10 is a block diagram of an example layered LDPC decoder.

FIG. 10 is a block diagram of an example layered LDPC decoder 1000. The layered LDPC decoder 1000 includes a check node unit processing component 1030, a memory for R messages 1032, a memory for Q messages 1012, and a cyclic shifter 1020. Processing for one layer can be performed as follows. Each parity check node (row) in the current layer updates and stores its corresponding R messages (messages it provides to its bit node neighbors) by gathering Q messages from its bit node neighbors and computing Equation 6.

$$R \approx \min(Q_1, \ldots, Q_{d_c-1}) \cdot \prod_{k=1}^{d_c-1} \text{sign}(Q_k) \qquad \text{(Equation 6)}$$

The new Q messages gathered in this computation are denoted as $Q_{new}$ messages 1022 (to distinguish them from the existing messages in Q memory) and are computed using the layered decoder variable node processor. Denoting one parity check node in the currently processed layer by S and denoting by V one bit node connected to S, the layered decoder variable node processor operation for a variable node, V, can be realized as $Q_{new}:=Q_{old}+R_{new}-R_{old}$, where $R_{new}$ 1028 is the message from a check node S' (≠S) connected to node V that was most recently updated by layered decoder (in one of the earlier processed layers), and $R_{old}$ 1026 is the message sent to node V from S during last update. The message $Q_{old}$ 1014 is the message from the bit node V to the check node S' that was updated earlier during the processing of the layer corresponding to the node S'. Based on the accessed $R_{new}$ message and the $Q_{old}$ message, a P message is generated and processed by the cyclic shifter 1020 before subtracting the $R_{old}$ message to obtain the $Q_{new}$ message. After the processing of check node S using check note unit processing component 1030 (i.e. processing of the layer corresponding to the check node S), new data ($Q_{new}$) is written into R memory 1032.

A-priori message is received by the Q memory 1012. During variable node processing, a layered decoder uses one read access to retrieve $Q_{old}$ 1014 from the Q memory 1012, one read access to R memory 1032 (to read $R_{new}$ 1028), and one write access to update the $Q_{new}$ message 1022 in the Q memory 1012. When the R messages are stored in a compact form (as described above), even though technically another read access to R memory is needed to get $R_{old}$ 1026, the storage of this message can be shared by all the bits checked by a given equation. As a result, memory containing $R_{old}$ 1026 is only read once for each equation. This reduces the number of ports required for the R memory 1032.

Layered LDPC decoder needs one Q memory 1012 to store bit-to-check messages Q, and one R memory 1032 to store check-to-bit messages R. As shown in FIG. 10, the quasi-cyclic nature of the LDPC code permits evaluation of B equations in parallel, thus improving decoder throughput rate. Hence Q and R messages are grouped into sets of B messages, and memories read or write accesses are performed with B messages at a time.

Figure 11:
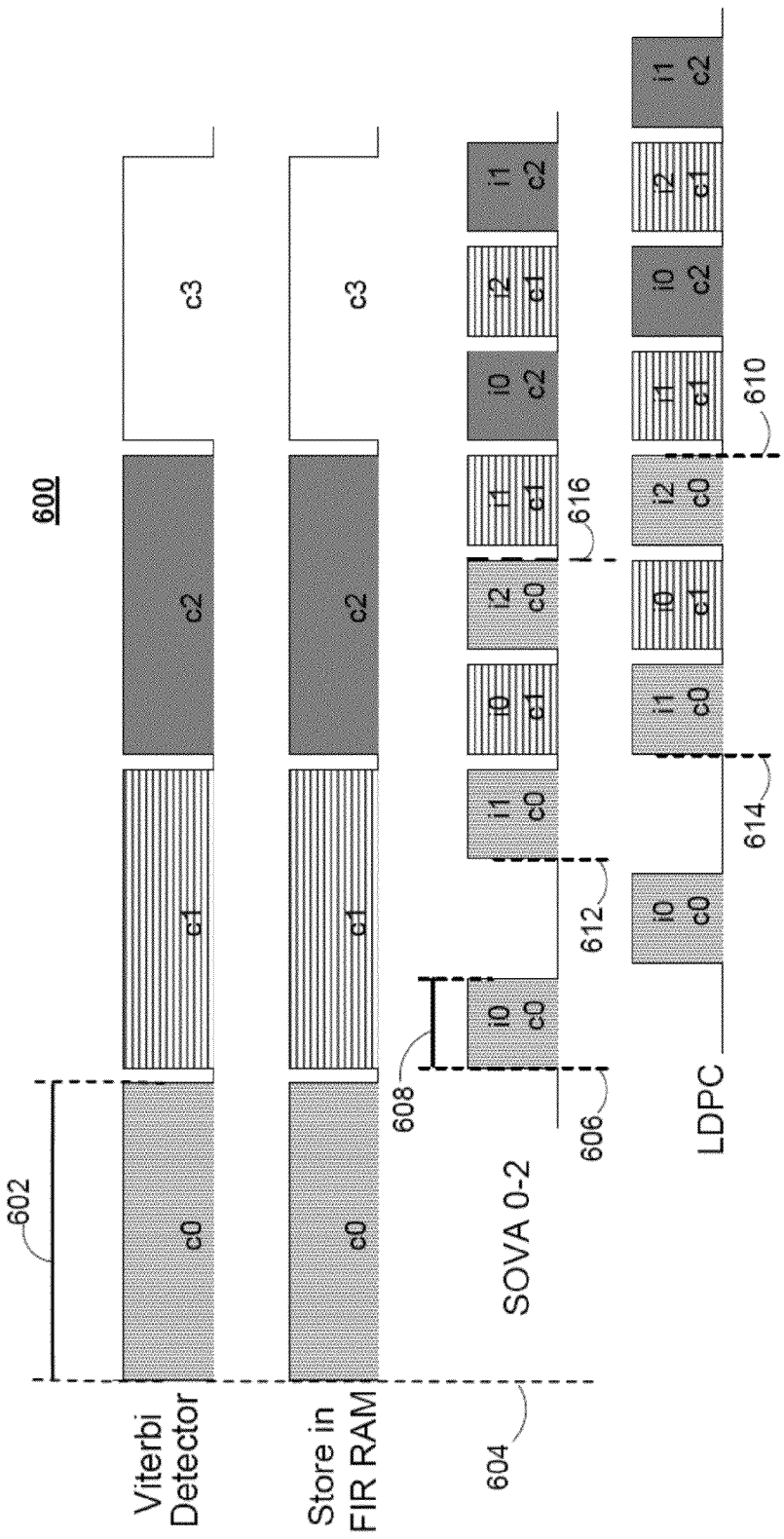
FIG. 11 is an example timing diagram for an iterative decoder architecture.

In order to achieve better hardware resource utilization for the iterative decoder (e.g., iterative decoder 170), two iterative code words are decoded simultaneously: when SOVA decoder operates on current codeword, LDPC decoder processes previous codeword, and vice-versa. FIG. 11 shows an example timing diagram for an iterative decoder architecture. U.S. patent application Ser. No. 12/329,581, filed Dec. 6, 2008 and entitled "Iterative Decoder Systems and Methods" describes the iterative decoder architecture including the timing diagram. The contents of U.S. patent application Ser. No. 12/329,581 are incorporated by reference. Consequently, the memories should be configured to have sufficient capacities to store two sets of data: one for current codeword and one for the previous codeword. This can be realized through doubling the number of memory elements at the cost of implementation area, as shown in FIG. 12 below.

Figure 12:
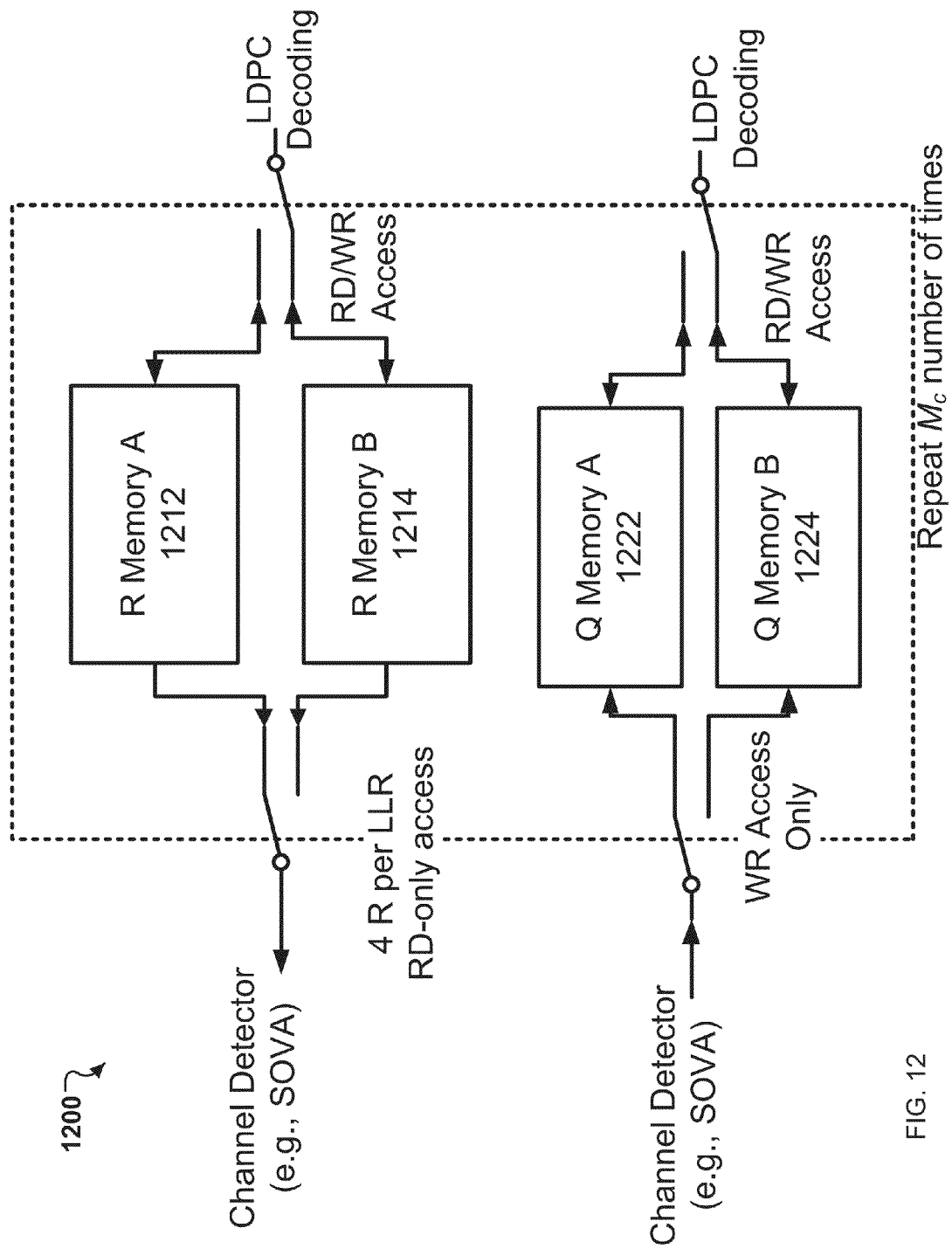
FIG. 12 is a diagram showing an example memory arrangement for an iterative decoder, such as an LDPC decoder.

FIG. 12 is a diagram showing an example memory arrangement 1200 for layered iterative decoder. The memory arrangement 1200 can be implemented for the memory component 176 shown in FIG. 1b. FIG. 12 shows an R memory arrangement. The R memory is organized as two banks of memories 1212 and 1214 to store R data associated with the current codeword and R data associated with the previous codeword. The two banks 1212 and 1214 of R memory represent a ping-pong memory structure. One bank of R memory 1212 stores the R data for the current codeword being decoded by a code decoder, such as the LDPC decoder, while the other bank of R memory 1214 stores the R data for the previous code word so that the memory can be read to serialize extrinsic LLR data that will be used by a channel detector to perform SOVA decoding of a previous codeword.

To compute LDPC extrinsic LLR, the R memory bank 1212 should provide dv R messages to channel SISO detector. In this implementation, LLR EXT is computed as the sum of R messages from all the checks connected to a given variable node V. In some implementations, dv=4 (i.e. column weight of H is 4). For these implementations, the SOVA processor does not need read access to Q memory 1222, and only write access is needed to store new Q message reflecting new information derived from the SOVA decoder. At the same time, bank 1224 of Q memory is being accessed by an LDPC decoder (decoding previous codeword) to provide read/write access to an LDPC decoder. Also R memory bank 1214 is in communication with an LDPC decoder to provide read/write access.

Figure 13:
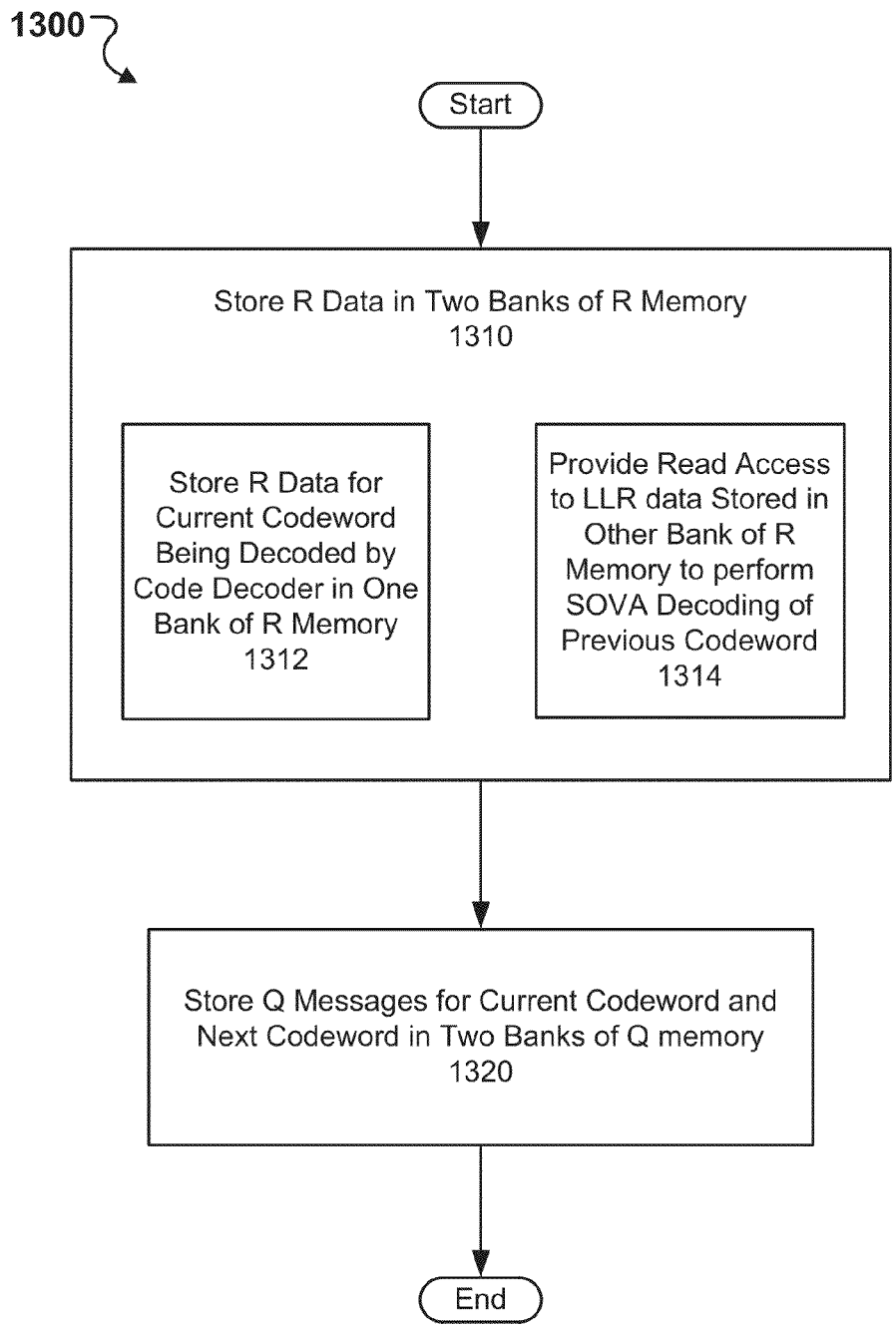
FIG. 13 shows an example process for providing two banks of R memory and two banks of Q memory.

FIG. 13 shows an example process 1300 for providing two banks of R memory and two banks of Q memory. R data for the current code word and R data for the previous code word are stored in an R memory component (e.g., memory banks 1212 and 1214 of R memory) at 1310. Storing the R data in the R memory includes operating the R memory as a ping-pong memory structure. For example, at 1312, R data for the current codeword being decoded by a code decoder, such as the LDPC decoder is stored in one bank of R memory (e.g., bank 1212) while the other bank of R memory (e.g., bank 1214) stores the R data for the previous codeword so that the memory bank can be read to provide extrinsic LLR data that will be used by a channel detector to perform SOVA decoding of a previous codeword at 1314. The Q, messages for a current codeword and previous codeword are stored in the Q memory at 1320.

The area-efficiency of these memory elements (e.g., R memory banks 1212 and 1214) can be improved by merging the R data corresponding to the two separate codewords into a single memory element with doubled the number of entries. However, the gains achieved by merging the two data sets should not be negated by additional read/write access ports for independent read/write accesses.

Figure 14:
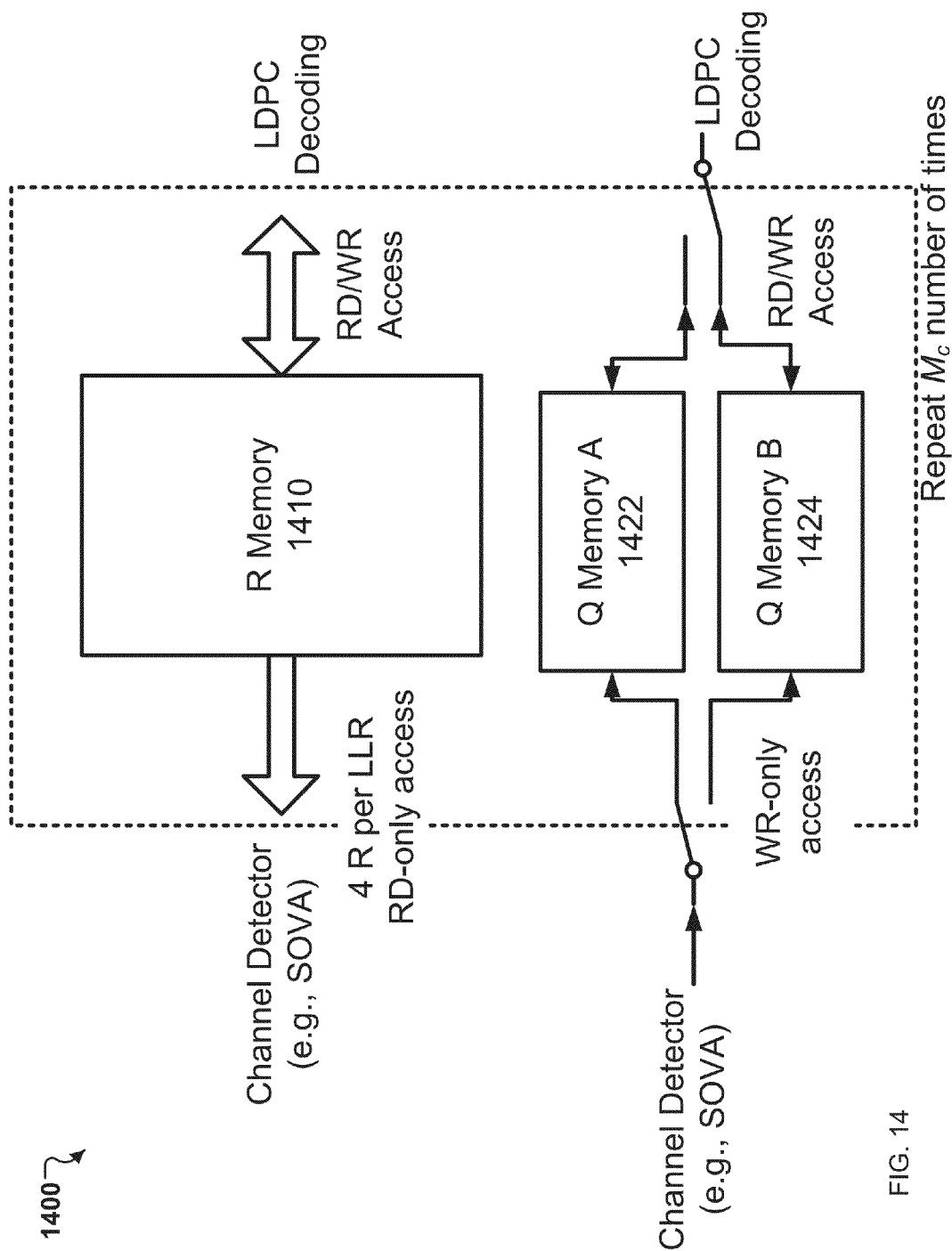
FIG. 14 is a diagram showing another example memory arrangement for an iterative decoder.

FIG. 14 is a diagram showing another example memory arrangement 1400 for an iterative decoder that uses a single R memory component to store R data associated with the current codeword and R data associated with the previous codeword. The memory arrangement 1400 can be implemented for the memory component 176 shown in FIG. 1b. To implement memory modules with smaller areas, the two banks of R memories described with respect to FIG. 12 can be combined into one memory component with an increased number of addresses. By replacing the ping-pong structure of the R memory with a combined memory module, the memory density is improved.

The memory arrangement 1400 includes a single R memory 1410 that replaces the ping-pong structure of memory arrangement 1200. The single R memory can be a single port memory. The output of the single R memory bank 1410 is provided to a SOVA decoder. In addition, the R memory is in communication with an LDPC decoder to provide read/write access.

The memory arrangement 1400 also includes Q memory that includes two banks 1422 and 1424. The Q memory banks 1222, 1224 storing data for a current codeword and a previous codeword Similar to the memory arrangement on FIG. 12, the Q memory is in communication with a SOVA decoder to provide write access only. Also, the Q memory is in communication with an LDPC decoder to provide read/write access.

Similar to the memory arrangement 1200, each extrinsic LLR output of the R memory 1410 can provide $d_v$ R information read access. The two banks 1422 and 1424 of Q memory can provide read/write access to an LDPC decoder and write-only access to a channel detector, such as a SOVA decoder.

Figure 15:
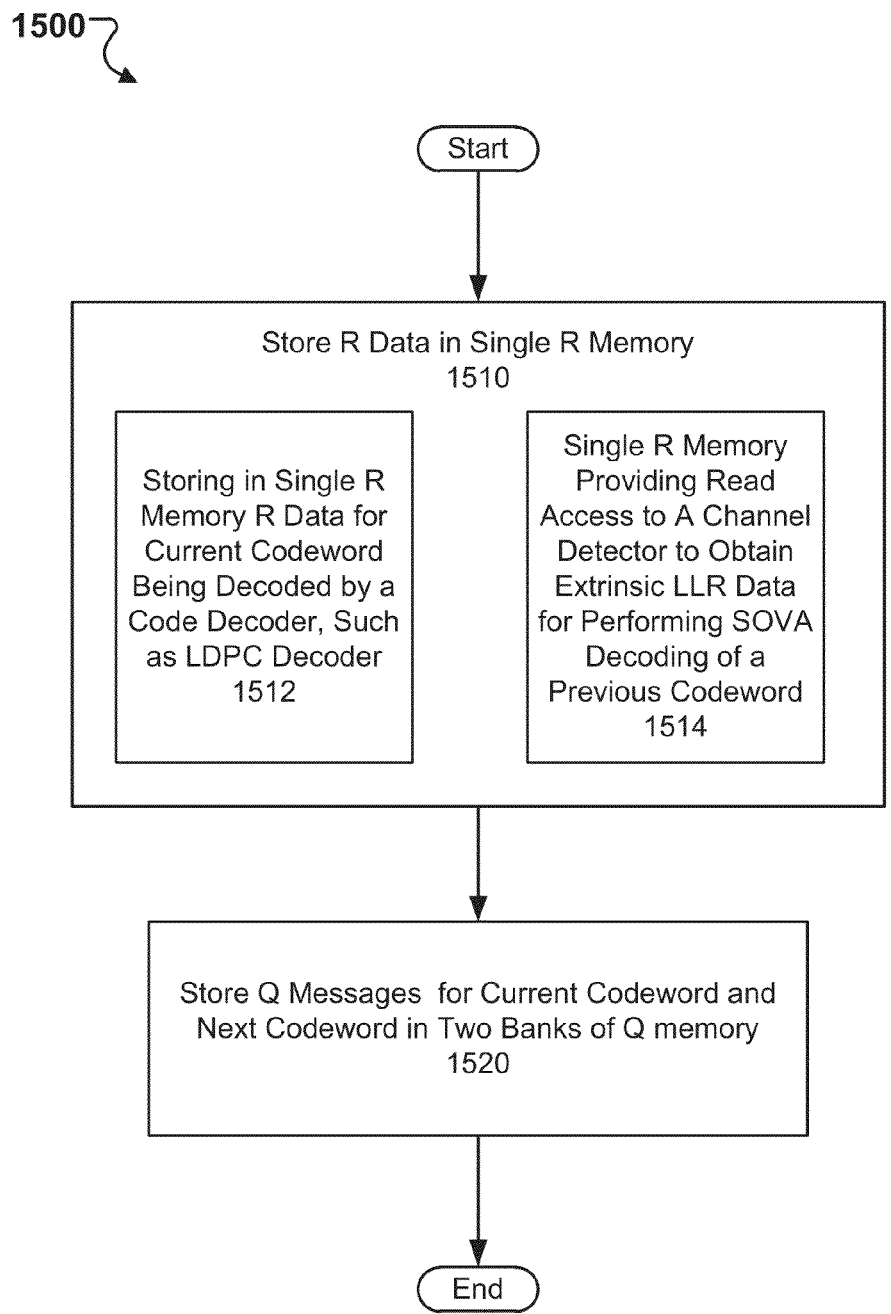
FIG. 15 shows an example process 1300 for implementing a memory arrangement that includes one R memory and two banks of Q memory.

FIG. 15 shows an example process 1300 for implementing a memory arrangement that includes one R memory and two banks of Q memory. R data is stored in a single R memory component (e.g., single R memory 1410) at 1510. Storing the R data for the current codeword being decoded by a code decoder, such as the LDPC decoder at 1512. In addition, storing the R data for the previous codeword, R memory providing read access to a channel detector to obtain extrinsic LLR data for performing SOVA decoding of a previous codeword at 1514.

The Q data for a current codeword and a previous codeword are stored in Q memory at 1520. In particular, the Q data for the current code word and the previous codeword are stored in the two banks (e.g., banks 1422 and 1424) of the Q memory.

At the end of LDPC decoding, an extrinsic LLR (Equation 8) can be realized through repeated read access to R memory 1410 in order to evaluate $$LLR_{EXT}(v) = \sum_{j=1}^{d_v} R_j.$$

Because two codewords are being processed simultaneously by the iterative decoder, the LDPC decoder outputs $LLR_{EXT}$ for the previous codeword while processing all the variable node and check node operations for layered LDPC decoding of the current codeword. This places a challenging constrain on the read access bandwith of the R memory 1410.

A further simplification of the memory arrangement can be obtained by using a different approach to compute LLR EXT information during SOVA processing. Thus far, using $$LLREXT(V) = \sum_{i=1}^{dv} R_i$$

to compute LDPC extrinsic LLR have been described. This can place significant burden on R memory bandwidth (due to the need to have $d_v$ read access per one variable node). In some implementations, LLR EXT can be computed as LLR-EXT(V)=Q+$R_{new}$−$LLR_{SOVA\_ext}$=LLR_APP−$LLR_{SOVA\_ext}$. By computing the LLR EXT in this manner, one read access to Q memory and one read access to R memory per bit are sufficient. In addition, an extra memory is needed to store channel extrinsic information. However, the benefit from streamlining the R memory easily outweighs the extra complexity due to having additional SOVA extrinsic LLR memories.

Figure 16:
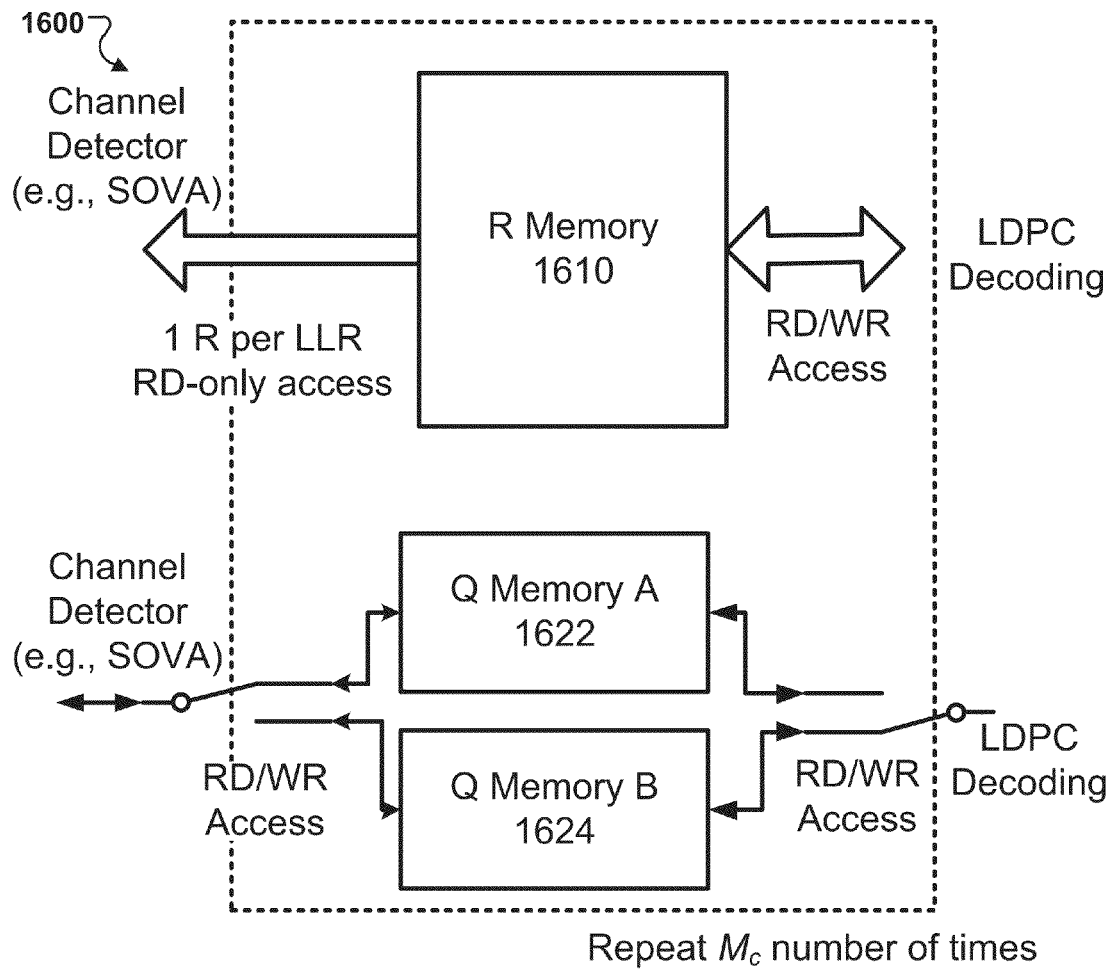
FIG. 16 is a diagram showing another example of memory arrangement for an iterative decoder.

FIG. 16 is a diagram showing an example memory arrangement that uses additional memory for storing channel extrinsic information. The memory arrangement 1600 can be implemented for the memory component 176 shown in FIG. 1b. The additional memories (e.g., channel detector memories) to store the channel extrinsic information are also included. The channel detector memories can includes an extrinsic channel LLR memory. Examples of the channel detector memories include SOVA memories 1632 and 1634. As for other memories, a pair of SOVA memories is included to store information (e.g., Q messages) for current and previous code words.

The memory arrangement 1600 includes a single R memory 1610 that replaces the ping-pong structure of memory arrangement 1200. A data associated with the current codeword and R data associated with the previous codeword are stored in the single R memory component (e.g., single R memory 1610). The single R memory 1610 can be a single port memory. The output of the single R memory bank of the single R memory 1610 is provided to a channel detector, such as a SOVA decoder. In addition, the single R memory bank of the single R memory 1610 is in communication with an LDPC decoder to provide read/write access.

In addition, the Q memory is arranged to include two banks 1622 and 1624 as described with respect to arrangement 1400. The Q memory is organized as 2 banks of Q memories 1622, 1624 storing data for a current codeword and a previous codeword. The Q memory banks 1622 and 1624 are in communication with a channel detector, such as a SOVA decoder to provide read/write access. Also, the Q memory is in communication with an LDPC decoder to provide read/write access.

Figure 17:
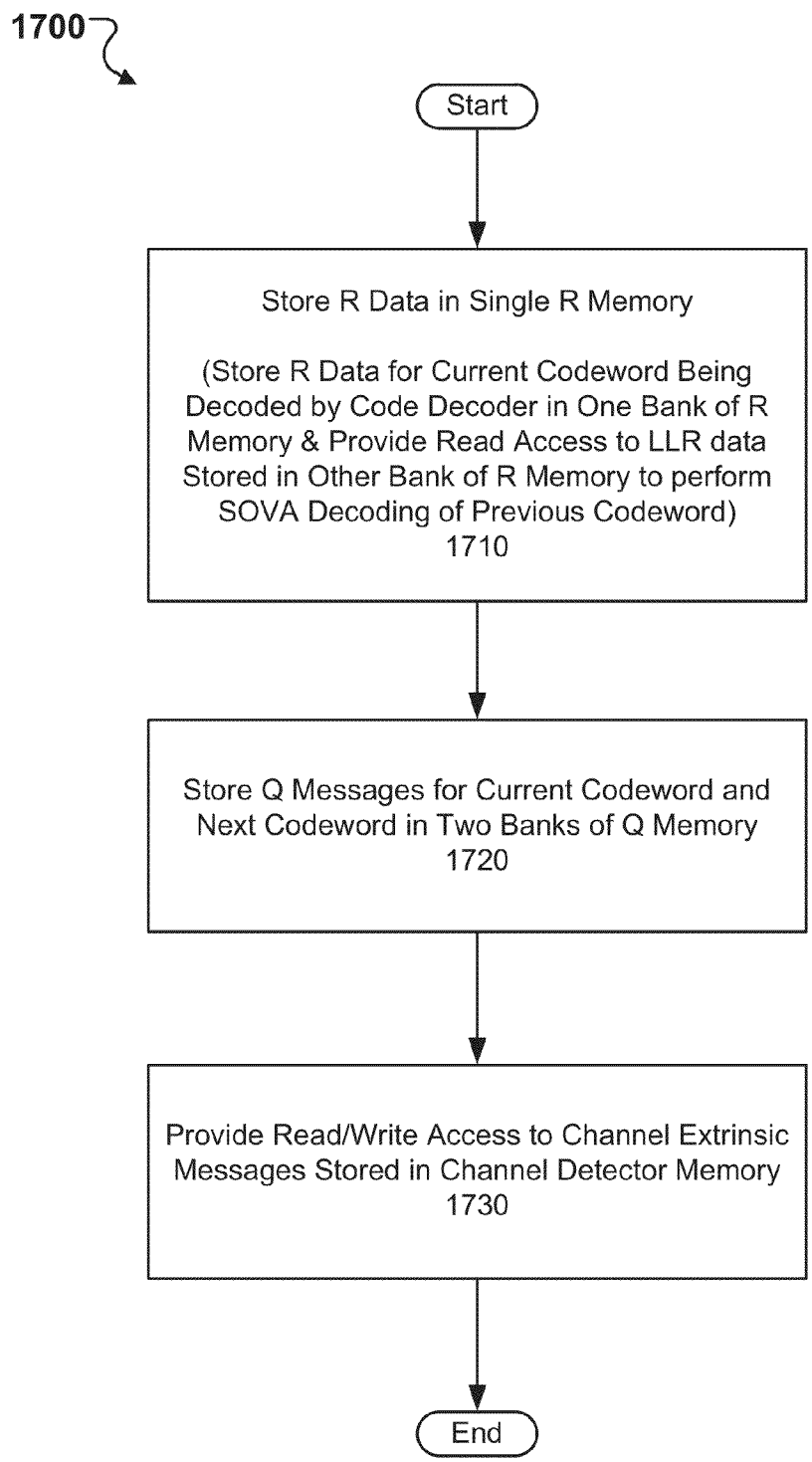
FIG. 17 shows an example process for implementing a memory arrangement that includes separate channel detector memory.

FIG. 17 shows an example process 1700 for implementing a memory arrangement that includes separate channel detector memory. At 1710, R data associated with the current codeword and R data associated with the previous codeword are stored in a single R memory component (e.g., single R memory 1610). Storing the R data includes storing in the single R memory, the R data for the current codeword being decoded by a code decoder, such as the LDPC decoder. In addition, storing the R data for the previous codeword includes the single R memory providing read access to a channel detector to obtain extrinsic LLR data for performing SOVA decoding of a previous codeword.

The Q messages for a current codeword and a previous codeword are stored in the Q memory at 1720. In the data for the current code word and the previous codeword are stored in the two banks of the Q memory (e.g., the two banks 1622 and 1624).

In addition, channel detector memory (e.g., banks 1632 and 1634) provides one read and one write access to channel extrinsic messages, lambda, stored in the channel detector memory at 1730. The lambda messages stored in the channel detector memory includes the extrinsic LLR data for performing SOVA decoding of a previous codeword.

This embodiment implements $$LLR_{EXT}(v) = \sum_{j=1}^{d_v} R_j = Q + R_{new} - \lambda,$$

for which one read access for each of Q and R memories is sufficient, as opposed to $d_v$ read accesses to R memory. The overhead is two additional memories 1632 and 1634 to store the channel LLR (λ). Because channel throughput is significantly lower than the LDPC decoder iteration throughput, the read access of $R_{new}$ corresponding to the previous codeword can be interleaved amongst read access for LDPC decoding of the current codeword. Thus, no additional read ports are needed from the merged R memory 1610.

Interleaving of read access to R memory cannot be arbitrarily performed, but needs additional constraints on the LDPC code. The process of interleaving read access to R memory can be found in U.S. patent application Ser. No. 61/098,139 filed on Sep. 18, 2008 and entitled "Circulant Processing Scheduler for Layered LDPC Decoder", the contents of which are incorporated by reference.

Because channel throughput is significantly lower than the LDPC decoder iteration throughput, the read and write access bandwidth of the channel memories 1632 and 1634 is small compared to Q and R memories. Thus, the area overhead of channel memories 1632 and 1634 is small compared to the savings of a single R memory 1610 with a single set of read and write ports.

A few embodiments have been described in detail above, and various modifications are possible. The disclosed subject matter, including the functional operations described in this specification, can be implemented in electronic circuitry, computer hardware, firmware, software, or in combinations of them, such as the structural means disclosed in this specification and structural equivalents thereof, including potentially a program operable to cause one or more data processing apparatus to perform the operations described (such as a program encoded in a computer-readable medium, which can be a memory device, a storage device, a machine-readable storage substrate, or other physical, machine-readable medium, or a combination of one or more of them).

The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A program (also known as a computer program, software, software application, script, or code) can be written in any form of programming language, including compiled or interpreted languages, or declarative or procedural languages, and it can be deployed in any form, including as a stand alone program or as a module, component, subroutine, or other unit suitable for use in a computing environment. A program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A program can be deployed to be executed on one computer or on multiple computers that are located at one site or distributed across multiple sites and interconnected by a communication network.

While this specification contains many specifics, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments.

Other embodiments fall within the scope of the following claims.

What is claimed is:

1. An apparatus comprising:
R banks;
Q banks;
circuitry configured to store R data for a current codeword in a first R bank of the R banks and store R data for a previous codeword in a second R bank of the R banks;
circuitry configured to alternate among the R banks for storing current codeword R data;
circuitry configured to store Q data for the current codeword in a first Q bank of the Q banks and store Q data for the previous codeword in a second Q bank of the Q banks; and
circuitry configured to alternate among the Q banks for storing current codeword Q data.

2. The apparatus of claim 1, comprising:
circuitry configured to interleave read accesses among the R banks.

3. The apparatus of claim 1, comprising:
an iterative decoder communicatively coupled with the R banks and the Q banks,
wherein the iterative decoder is configured to interleave one or more read accesses for the R data associated with the previous codeword with one or more read accesses for the R data associated with the current codeword.

4. The apparatus of claim 1, comprising:
a single port memory component that includes the R banks.

5. The apparatus of claim 1, comprising:
a channel detector memory component to store channel extrinsic information associated with the current and previous codewords; and
an iterative decoder communicatively coupled with the R banks, the Q banks, and the channel detector memory component.

6. The apparatus of claim 5, wherein the iterative decoder comprises:
a channel detector configured to generate a message based on a single read access from among the Q banks and a single read access from among the R banks, wherein the single read access from among the R banks is for accessing one of the R banks.

7. The apparatus of claim 6, wherein the channel detector comprises a soft output Viterbi algorithm decoder.

8. A system comprising:
a channel detector;
a code decoder that is communicatively coupled with the channel detector, the code decoder to decode codewords comprising a current codeword and a previous codeword, wherein the code decoder and the channel detector form an iterative decoder;
R banks;
Q banks;
circuitry configured to store R data for a current codeword in a first R bank of the R banks and store R data for a previous codeword in a second R bank of the R banks;
circuitry configured to alternate among the R banks for storing current codeword R data;
circuitry configured to store Q data for the current codeword in a first Q bank of the Q banks and store Q data for the previous codeword in a second Q bank of the Q banks; and
circuitry configured to alternate among the Q banks for storing current codeword Q data.

9. The system of claim 8, comprising:
circuitry configured to interleave read accesses among the R banks.

10. The system of claim 8, wherein the iterative decoder is configured to interleave one or more read accesses for the R data associated with the previous codeword with one or more read accesses for the R data associated with the current codeword.

11. The system of claim 8, comprising:
a single port memory component that includes the R banks.

12. The system of claim 8, wherein the channel detector is configured to generate a message based on a single read access from among the Q banks and a single read access from among the R banks, wherein the single read access from among the R banks is for accessing one of the R banks.

13. The system of claim 8, wherein the channel detector and the code decoder are operable to pass a bit reliability metric comprising a log-likelihood-ratio message between each other.

14. The system of claim 8, wherein the code decoder comprises a low density parity check code decoder.

15. A method comprising:
storing first R data for a current codeword in a first R bank of two or more R banks;
storing second R data for a previous codeword in a second R bank of the two or more R banks;
alternating among the two or more R banks for storing current codeword R data;
storing first Q data for the current codeword in a first Q bank of two or more Q banks;
storing second Q data for the previous codeword in a second Q bank of the two or more Q banks; and
alternating among the two or more Q banks for storing current codeword Q data.

16. The method of claim 15, comprising:
interleaving read accesses among the R banks.

17. The method of claim 15, comprising:
operating an iterative decoder to process codewords comprising the current codeword and the previous codeword, wherein operating the iterative decoder comprises interleaving one or more read accesses from a channel detector for the second R data associated with the previous codeword with one or more read accesses from a code decoder for the first R data associated with the current codeword.

18. The method of claim 17, comprising:

operating the channel detector to generate a message based on a single read access from among the two or more Q banks and a single read access from among the two or more R banks, wherein the single read access from among the two or more R banks is for accessing one of the first R data or the second R data.

19. The method of claim 17, wherein the channel detector comprises a soft output Viterbi algorithm decoder, and wherein the code decoder comprises a low density parity check code decoder.

20. The method of claim 17, wherein the iterative decoder includes the code decoder and the channel detector.

* * * * *